US005394302A

United States Patent [19]

[11] Patent Number: 5,394,302

Trautwein et al.

[45] Date of Patent: Feb. 28, 1995

[54] IGNITION COIL FOR INTERNAL COMBUSTION ENGINES

[75] Inventors: Karl-Heinz Trautwein, Sulzberg; Reinhold Herrmann, Stuttgart; Karl-Heinz Nuebel, Schwieberdingen, all of Germany

[73] Assignee: Robert Bosch GmbH, Stuttgart, Germany

[21] Appl. No.: 230,717

[22] Filed: Apr. 21, 1994

[30] Foreign Application Priority Data

Jun. 1, 1993 [DE] Germany ............................ 4318130

[51] Int. Cl.[6] ........................ H05K 7/00; H01F 27/04

[52] U.S. Cl. ........................................ 361/728; 336/92; 336/107; 336/192

[58] Field of Search ........................ 361/728; 123/634; 336/90, 92, 96, 105, 107, 192

[56] References Cited

U.S. PATENT DOCUMENTS 5,170,767 12/1992 Wada et al. ........................ 336/192

FOREIGN PATENT DOCUMENTS 3937828 6/1991 Germany .
2064227 6/1981 United Kingdom ................ 123/634

*Primary Examiner*—Thomas J. Kozma
*Attorney, Agent, or Firm*—Michael J. Striker

[57] ABSTRACT

An ignition coil for an internal combustion engine has a housing composed of an insulating material and having an insertion opening, at least one ring-shaped core composed of a soft magnetic material and having a portion insertable in the housing, a primary coil body and a secondary coil body, a primary coil and a secondary coil wound on the primary coil body and the secondary coil body and arranged coaxially to one another on the portion of the core, the housing being provided with a high voltage dome extending substantially perpendicularly to a central axis of the coil bodies, a connecting pin insertable along a longitudinal axis of the high voltage dome and connected via a diode with a high voltage winding end of the secondary coil. The connecting pin, the diode and the coil bodies with the coils together form an operationally premounted assembly insertable through the insertion opening in the housing. A spacer connected with one of the coil bodies. The housing completely surrounds the core. The connecting pin and the diode is received in the spacer, the diode is arranged coaxially to the longitudinal axis of the high voltage dome.

6 Claims, 1 Drawing Sheet

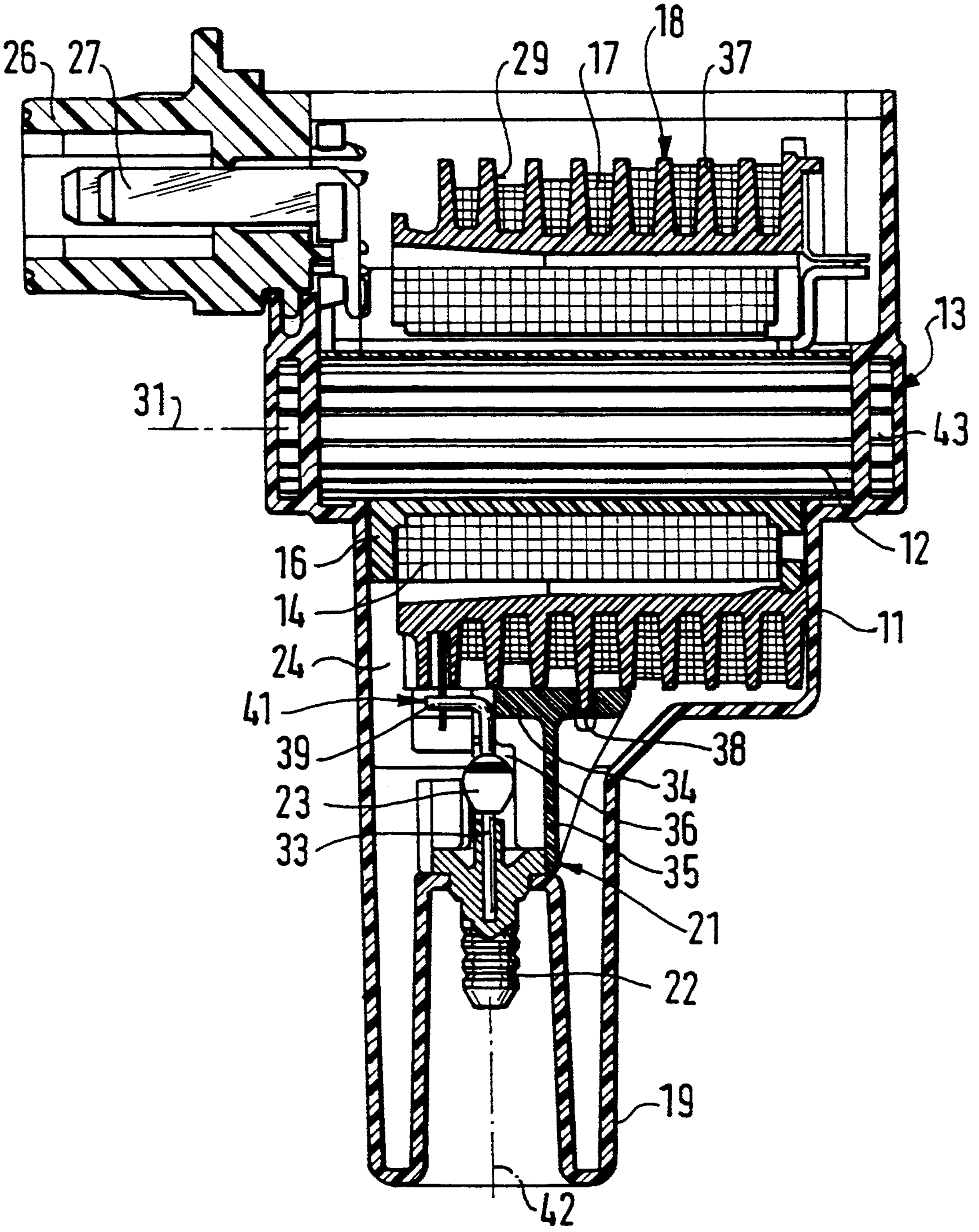
26
27
29
17
18
37
13
31
43
12
16
14
11
24
41
39
38
34
23
36
33
35
21
22
19
42

IGNITION COIL FOR INTERNAL COMBUSTION ENGINES

BACKGROUND OF THE INVENTION

The present invention relates to an ignition coil for internal combustion engines.

More particularly, it relates to an ignition coil which has a housing composed of an insulating material, a ring-shaped core insertable into the housing and composed of soft magnetic material and primary and secondary windings wound on the core.

Ignition coils of the above mentioned general type are known in the art. One of such ignition coils is disclosed for example in the German document DE 39 37 828 C1. The ignition coil disclosed in this reference has a housing provided with a lateral insertion opening and a coil body provided with a primary coil and a secondary coil and insertable through the insertion opening into the housing. The mounting of this ignition coil is performed so that the coil body is first finally wound outside of the housing and premounted functionally with connection plug for primary and secondary connections. After the operational testing this structural assembly is inserted through the insertion opening into the housing and fixed there with testing resin.

In the known embodiment, during the premounting of the secondary connection it is necessary in a first manufacturing step to insert a diode between a connecting pin of the secondary connection at the high voltage winding end of the secondary coil and to provide electrical contacting. In a second manufacturing step then the connecting pin is mounted on the coil body of the secondary coil.

During performing the second manufacturing step the mounting forces on the connecting pin are transferred in disadvantageous manner to the diode which is connected with its one end with the secondary coil so that there is a danger that the diode or its contact is damaged. Furthermore, after performing the second manufacturing step the diode is arranged relative to the coil body of the secondary coil so that it is transverse to the chambers which locally receive the secondary coil and is immediately adjacent to several chambers. Since the voltage level increases from chamber to chamber for high voltage winding and of the secondary coil, there is a danger that along the diode a shunt for a voltage equalization forms between the individual chambers. For preventing this, in the known ignition coils the ribs which form the chambers and extend outwardly project substantially over the clamped level from the coil winding. This leads to a great structural volume of the ignition coil which is of course undesirable.

SUMMARY OF THE INVENTION

Accordingly, it is an object of the present invention to provide an ignition coil for internal combustion engines, which avoids the disadvantages of the prior art.

In keeping with these objects and with others which will become apparent hereinafter, one feature of the present invention resides, briefly stated, in an ignition coil in which the housing completely receives the core, the connecting pin and the diode are received in a spacer connected with the coil body, and the diode in its longitudinal extension is arranged substantially coextensive with the longitudinal axis of the high voltage dome.

When the ignition coil is designed in accordance with the present invention, it has the advantage that the above mentioned problems are avoided in a satisfactory manner.

Since the ignition coil has a spacer in which the diode is form-lockingly received, the mounting forces which occur at the connecting pin and are transmitted on the diode through its connection with the connecting pin are unloaded by the spacer and thereby it is protected.

The diode by binding in the spacer after its manufacture is arranged on the coil body of the secondary coil in the ignition coil so that it extends substantially coaxial with the longitudinal axis of the high voltage dome of the ignition coil and therefore it extends along one chamber. Since inside a chamber at the winding outer side of the part of the secondary coil located in it no substantial voltage differences occur, there is no danger of current spark-over along the diode. Therefore the ribs which form the walls of the chambers do not need special projections over the winding level for providing a protection of the diode from the secondary coil. Therefore, the structural volume of the ignition coil can be retained small, and the ignition coil can be used in narrow application conditions.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

The single FIGURE of the drawings is a view showing an longitudinal section of an ignition coil.

DESCRIPTION OF THE PREFERRED EMBODIMENTS

An ignition coil for an internal combustion engines as shown in the drawing has a housing 11 and a core 13 composed of a soft magnetic material and closed in a ring-shaped manner. The core 13 has a portion 12 insertable in the housing 11. A primary coil 14 is arranged on a primary coil body 16 and a secondary coil 17 is arranged on a secondary coil body 18. They are coaxial relative to one another and to the portion 12. A high voltage dome 19 projects from a base body of the housing 11. A spacer 21 mounted on the secondary coil body 18 is located adjacent to the high voltage dome 19. The spacer 21 carries a connecting pin 22 extending into the high voltage dome 19 and also a diode 23.

The housing 11 is formed as a synthetic plastic injection molded part of an electrical insulating material. It has a base body having a substantially square cross-sectional surface and a high voltage dome 19 extending outwardly from it and formed as a trough. Its open side forms an insertion opening 24 for the above mentioned elements 13–23 and for a casting resin which closes the housing 11.

A connecting plug 26 is mounted on the housing 11 as an additional part. Its contact element 27 is connected at one end with the winding end of the primary coil 14 and is connectable at the other end with a not shown low voltage source.

For producing the ignition coil the parallelepiped-shaped portion 12 of the core 13 is injection molded of synthetic plastic material over substantial part of its longitudinal extension with formation of the primary coil body 16 composed of a ring-shaped chamber, and the primary coil 14 is mounted on the primary coil body 16. The secondary coil body 18 composed of a synthetic plastic material with the secondary coil 17 wound on it and having a plurality of chambers 29 subdividing the secondary coil 17 into portions, is fitted on the above mentioned assembly and fixed on it for example by an arresting connection. Thereby both coil bodies 16 and 18 with the respective coils 14 and 17 are arranged coaxially to one another and to the portion 12 so that they have a common central axis 31.

For further assembly of the ignition coil the connecting pipe 22 and the diode 23 which is connected through a first connection 33 with the connecting pin 22 by a crimping connection, are inserted in a spacer 21. The spacer 21 is formed as a synthetic plastic injection molded part with a plate shaped foot 34 for mounting on the secondary coil body 18 and with a dome-shaped holding part 35 arranged perpendicularly to the foot 34. The holding part has a recess 36 which is form-lockingly adapted to the unit of the diode 23 and the connecting pin 23. The unit is inserted in the recess 36 so far that the diode 23 and the part of the connecting pin 22 are form-lockingly arrested. Thereby the unit in its longitudinal direction is oriented in the spacer 21 relative to the longitudinal axis of the holding part 35.

This structural unit is placed with the lower side of the foot 34 on an end side of the ribs 37 which form the lateral limits of the chambers 29. At least one of the ribs 37 is provided with several holding portions 38 extending beyond the end side of the ribs 37 and arrestable in corresponding holding opening in the foot 34. When the foot 34 is fixed on the end side of the ribs 37, the diode 23 anchored in the holding part 35 is arranged in the longitudinal direction of the rib 37 and connected through a second connection 39, which is wire-shaped as the first connection 33, with a wire-shaped high voltage winding end of the secondary coil 17 through a blade-clamp contact element 41. This connection, similarly to the connection between the first connection 33 and the connecting pin 22, can be obtained by different types of connections, for example by soldering, welding or riveting.

Such a completed assembly can be tested outside of the housing 1 as to its operation, and then inserted through the insertion opening 24 of the housing 11 to abutment against a bottom of the housing 11 opposite to the insertion opening 24. The connecting pin 22 and the diode 23 with its freely located second connection 33 assumes a position in which their longitudinal axes coincide with the longitudinal axis of the high voltage dome 19 to form a joint longitudinal axis 42.

Due to this arrangement the diode 23 is arranged in the region of its second connection 39 only over one of the chambers 29 and at most overlaps the width of the chamber 29. Therefore, the danger of the current spark over from the secondary coil 17 to the diode 23 due to the low voltage differences at the winding outer side of the part of the secondary coil 17 located in the chamber 29 is low. Because of this arrangement relative to the chambers 29, the diode 23 does not need a special protective distance from the secondary winding 17, therefore the structural volume of the ignition coil can be retained very low.

In addition, the diode 23 because of its embedding in the holding part 35 of the spacer 21 is unloaded for mounting forces of the connecting pin 22 connected with it. Therefore, the manufacturing safety of the ignition coil is increased.

The above described completed assembly is inserted in the housing 1. The ring-shaped terminal portion 43 of the core 13 which is already injection molded in the housing 11 connects the end sides of the portion 12 magnetically to form a closed magnetic circuit with formation of an air gap. The contact element 27 of the connection plug 26 is connected with the winding end of the primary winding 14. The housing is then cast with the use of a not shown filling means with a casting resin and its hardening makes the ignition coil operationally ready so that it can mounted in an internal combustion engine.

It will be understood that each of the elements described above, or two or more together, may also find a useful application in other types of constructions differing from the types described above.

While the invention has been illustrated and described as embodied in an ignition for an internal combustion engine, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. An ignition coil for an internal combustion engine, comprising a housing composed of an insulating material and having an insertion opening; at least one ring-shaped core composed of a soft magnetic material and having a portion insertable in said housing; a primary coil body and a secondary coil body; a primary coil and a secondary coil wound on said primary coil body and said secondary coil body and arranged coaxially to one another on said portion of said core, said housing being provided with a high voltage dome extending substantially perpendicularly to a central axis of said coil bodies; a connecting pin insertable along a longitudinal axis of said high voltage dome and connected via a diode with a high voltage winding end of said secondary coil, said connecting pin, said diode and said coil bodies with said coils together forming an operationally premounted assembly insertable through said insertion opening in said housing; and a spacer connected with one of said coil bodies, said housing completely surrounding said core, said connecting pin and said diode being received in said spacer, said diode being arranged coaxially to said longitudinal axis of said high voltage dome.

2. An ignition coil as defined in claim 1, wherein said spacer has a holding part provided with a recess, said diode having a first connection which is in contact with said connecting pin, said diode and said connecting pin forming a unit which is at least partially form-lockingly engageable in said recess of said holding part of said spacer.

3. An ignition coil as defined in claim 2; and further comprising a crimp connection providing the contact between said first connection of said diode and said connecting pin.

4. An ignition coil as defined in claim 2, wherein said diode has a second connection which extends outwardly beyond said spacer and is in contact with a high voltage winding end of said secondary coil.

5. An ignition coil as defined in claim 4; and further comprising a blade-clamp contact element providing the contact between said second connection of said diode and said high voltage winding end of said secondary coil.

6. An ignition coil as defined in claim 1, wherein said secondary coil body of said secondary coil has a plurality of ribs forming a plurality of chambers therebetween so that said secondary coil is received in said chambers, said diode being mounted on said secondary coil body by said spacer so that it is arranged over one of said chambers and overlaps at most a width of said one chamber.

* * * * *